(12) United States Patent
Mobasher

(10) Patent No.: US 10,803,791 B2
(45) Date of Patent: *Oct. 13, 2020

(54) BURROWS-WHEELER BASED STRESS PROFILE COMPRESSION

(71) Applicant: Samsung Display Co., Ltd., Yongin-si, Gyeonggi-do (KR)

(72) Inventor: Amin Mobasher, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/292,181

(22) Filed: Mar. 4, 2019

(65) Prior Publication Data

US 2020/0135095 A1    Apr. 30, 2020

Related U.S. Application Data

(60) Provisional application No. 62/753,856, filed on Oct. 31, 2018.

(51) Int. Cl.
*G09G 3/3208* (2016.01)
*H04N 19/60* (2014.01)
(Continued)

(52) U.S. Cl.
CPC ......... *G09G 3/3208* (2013.01); *H04N 19/119* (2014.11); *H04N 19/154* (2014.11);
(Continued)

(58) Field of Classification Search
CPC .................................................. H04N 19/119
(Continued)

(56) References Cited

U.S. PATENT DOCUMENTS

| 5,539,468 A | 7/1996 | Suzuki et al. |
| 6,137,914 A | 10/2000 | Ligtenberg et al. |

(Continued)

FOREIGN PATENT DOCUMENTS

| KR | 10-2015-0034948 A | 4/2015 |
| KR | 10-2019-0060909 A | 6/2019 |

OTHER PUBLICATIONS

Syahrul, Elfitrin, et al., "Lossless Image Compression Using Burrows Wheeler Transform (Methods and Techniques)", 2008 IEEE International Conference on Signal Image Technology and Internet Based Systems, 2008, pp. 338-343.

(Continued)

*Primary Examiner* — Javid A Amini
(74) *Attorney, Agent, or Firm* — Lewis Roca Rothgerber Christie LLP

(57) ABSTRACT

A method of stress compensation in a display includes converting a stress profile for a slice of the display from a first format to a second format based on a conversion ratio; transforming the converted stress profile for the slice of the display, with a first transformation, to form a compressed transformed stress profile; decompressing the compressed transformed stress profile to form a decompressed transformed stress profile; and transforming the decompressed transformed stress profile, with a second transformation, to form a decompressed stress profile, the second transformation being an inverse of the first transformation.

20 Claims, 12 Drawing Sheets

(51) Int. Cl.
*H04N 19/174* (2014.01)
*H04N 19/119* (2014.01)
*H04N 19/154* (2014.01)

(52) U.S. Cl.
CPC ........... *H04N 19/174* (2014.11); *H04N 19/60* (2014.11); *G09G 2320/046* (2013.01)

(58) Field of Classification Search
USPC ....................................................... 345/555
See application file for complete search history.

(56) References Cited

U.S. PATENT DOCUMENTS

| | | |
|---|---|---|
| 6,243,416 B1 | 6/2001 | Matsushiro et al. |
| 6,668,086 B1 | 12/2003 | Enokida |
| 6,819,793 B1 | 11/2004 | Reshetov et al. |
| 7,202,912 B2 | 4/2007 | Aneja et al. |
| 7,236,636 B2 | 6/2007 | Sakai et al. |
| 7,321,693 B2 | 1/2008 | Kadowaki |
| 7,576,888 B2 | 8/2009 | Sakai et al. |
| 7,619,596 B2 | 11/2009 | Tada |
| 7,750,938 B2 | 7/2010 | Grimes et al. |
| 7,974,478 B2 | 7/2011 | Bashyam et al. |
| 8,452,083 B2 | 5/2013 | Kambegawa |
| 8,478,057 B1 | 7/2013 | Cui et al. |
| 8,509,532 B2 | 8/2013 | Ushiku |
| 8,533,166 B1 | 9/2013 | Sulieman et al. |
| 8,553,301 B2 | 10/2013 | Tamura |
| 8,599,925 B2 | 12/2013 | Srinivasan |
| 8,659,793 B2 | 2/2014 | Takeishi |
| 8,660,347 B2 | 2/2014 | Tamura |
| 8,994,617 B2 | 3/2015 | Chaji et al. |
| 8,995,763 B2 | 3/2015 | Clark |
| 9,378,560 B2 | 6/2016 | Iourcha et al. |
| 9,495,894 B2 | 11/2016 | Yamanaka et al. |
| 9,584,696 B2 | 2/2017 | Beck |
| 9,697,765 B2 | 7/2017 | Chung et al. |
| 9,715,716 B2 | 7/2017 | Song et al. |
| 9,773,455 B2 | 9/2017 | Chung et al. |
| 9,812,067 B2 | 11/2017 | Yang et al. |
| 9,830,890 B2 | 11/2017 | Zhou et al. |
| 9,894,379 B2 | 2/2018 | Banerji et al. |
| 9,905,162 B2 | 2/2018 | Yoo |
| 9,966,035 B2 | 5/2018 | Kim et al. |
| 10,515,612 B2 * | 12/2019 | Mobasher ............ G09G 3/3208 |
| 2003/0043088 A1 | 3/2003 | Booth, Jr. et al. |
| 2004/0061672 A1 | 4/2004 | Page et al. |
| 2005/0225548 A1 | 10/2005 | Han et al. |
| 2005/0280766 A1 | 12/2005 | Johnson et al. |
| 2008/0048951 A1 | 2/2008 | Naugler, Jr. et al. |
| 2008/0317362 A1 | 12/2008 | Hosaki et al. |
| 2009/0052772 A1 | 2/2009 | Speirs et al. |
| 2009/0066613 A1 | 3/2009 | Nakamura et al. |
| 2009/0148059 A1 | 6/2009 | Matsuda |
| 2010/0257493 A1 | 10/2010 | Agarwal et al. |
| 2010/0316137 A1 | 12/2010 | Long et al. |
| 2011/0069076 A1 | 3/2011 | Lindholm et al. |
| 2011/0148894 A1 | 6/2011 | Duprat et al. |
| 2011/0188750 A1 | 8/2011 | Tamura |
| 2011/0243469 A1 | 10/2011 | McAllister et al. |
| 2012/0147799 A1 | 6/2012 | Nagara et al. |
| 2012/0320067 A1 | 12/2012 | Iourcha et al. |
| 2013/0170558 A1 | 7/2013 | Zhang |
| 2014/0055500 A1 | 2/2014 | Lai |
| 2014/0160172 A1 | 6/2014 | Lee |
| 2014/0168192 A1 | 6/2014 | Jeong et al. |
| 2014/0176409 A1 | 6/2014 | Kim et al. |
| 2014/0313360 A1 | 10/2014 | Lee et al. |
| 2015/0002378 A1 | 1/2015 | Nathan et al. |
| 2015/0015590 A1 | 1/2015 | Jeong et al. |
| 2015/0117774 A1 | 4/2015 | Yang et al. |
| 2015/0194096 A1 | 7/2015 | Chung et al. |
| 2015/0243201 A1 | 8/2015 | Chung et al. |
| 2016/0104411 A1 | 4/2016 | Nathan et al. |
| 2016/0372033 A1 | 12/2016 | Yoo |
| 2016/0373788 A1 | 12/2016 | Gamei et al. |
| 2016/0379550 A1 | 12/2016 | Jiang et al. |
| 2017/0122725 A1 | 5/2017 | Yeoh et al. |
| 2017/0256024 A1 | 9/2017 | Abraham et al. |
| 2019/0289308 A1* | 9/2019 | Mobasher ............ G06F 11/004 |

OTHER PUBLICATIONS

"Burrows-Wheeler Tranform CMSC 423", 26 pages.
Burrows, M., et al., "A Block-sorting Lossless Data Compression Algorithm", SRC Research Report 124, May 10, 1994, 24 pages, digital Systems Research Center, Palo Alto, California.
Extended European Search Report for corresponding European Patent Application No. 19191346.6, dated Mar. 6, 2020, 8 pages.
European Patent Office Extended Search Report dated May 2, 2019, for corresponding European Patent Application No. 19162833.8, 15 pages.
Kang, Wei, et al., "Compressing Encrypted Data: A Permutation Approach", Fiftieth Annual Allerton Conference Allerton House, UIUC, Illinois, USA, Oct. 2012 (IEEE), 5 pages.
Notice of Allowance issued in U.S. Appl. No. 15/983,014 by the USPTO, dated Aug. 28, 2019, 7 pages.
Office Action issued in U.S. Appl. No. 15/980,623 by the USPTO, dated Feb. 4, 2020, 6 pages.

* cited by examiner

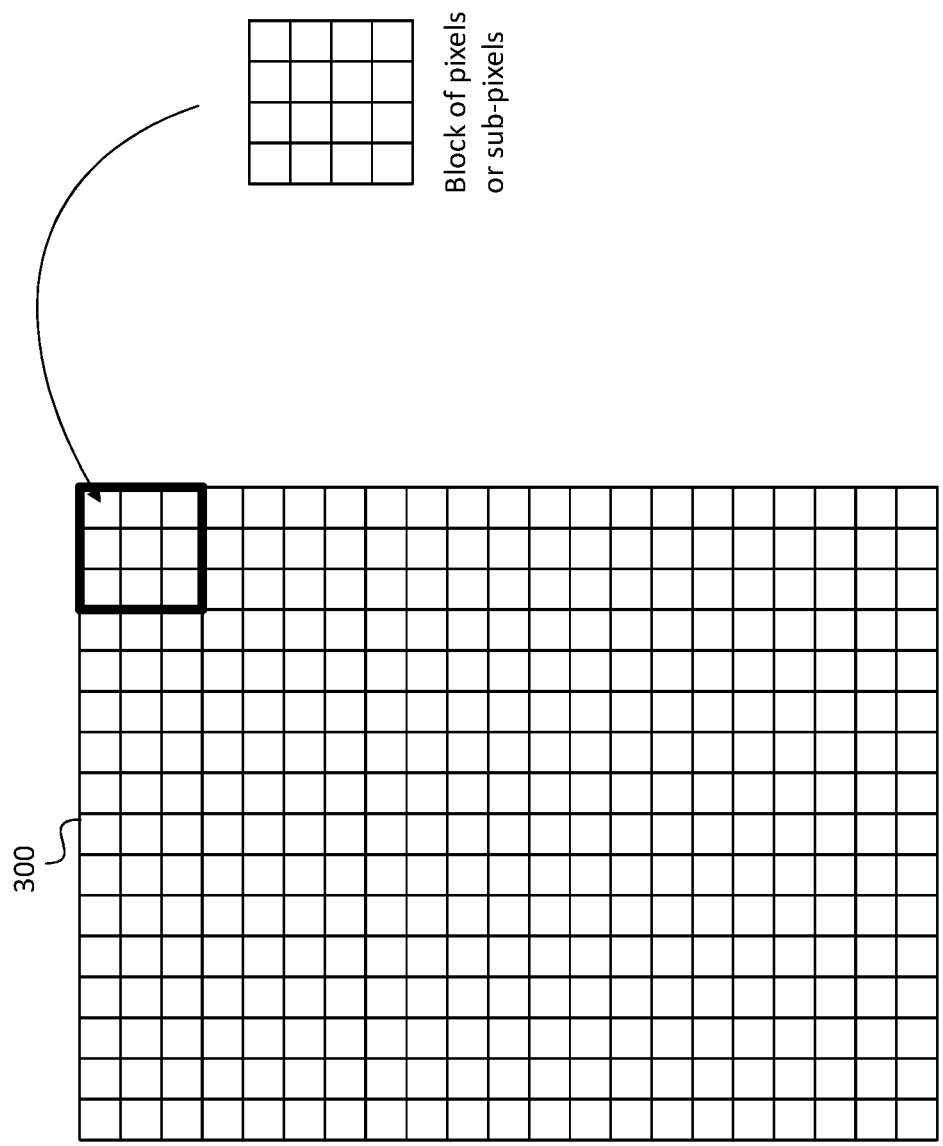

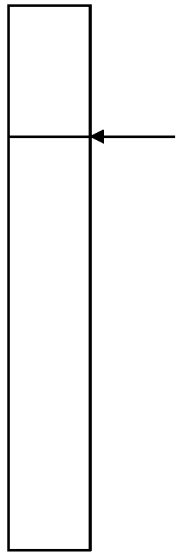
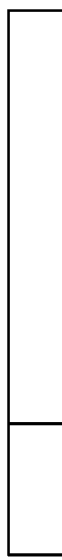
FIG. 6A
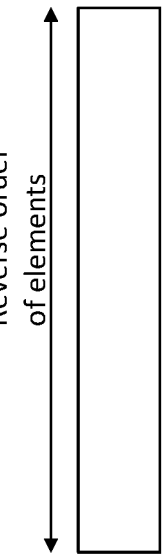
FIG. 6C
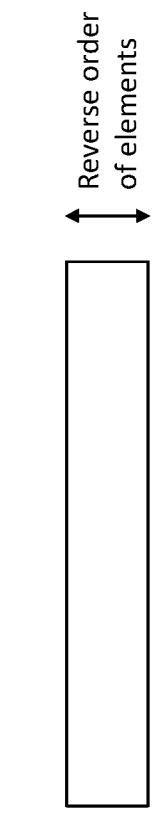
FIG. 6B

BURROWS-WHEELER BASED STRESS PROFILE COMPRESSION

CROSS-REFERENCE TO RELATED APPLICATION(S)

The present application claims priority to and the benefit of U.S. Provisional Patent Application Ser. No. 62/753,856, filed Oct. 31, 2018 and entitled "BURROWS-WHEELER BASED STRESS PROFILE COMPRESSION," the entire content of which is hereby expressly incorporated by reference.

FIELD

One or more aspects of embodiments according to the present disclosure relate to stress compensation or image sticking in a display, and more particularly to a system and a method for mitigating the effects of accumulated compression errors using Burrows-Wheeler based stress profile or image sticking compression.

BACKGROUND

Compensation for output decline in a video display such as an organic light-emitting diode (OLED) display may be used to preserve image quality as a display ages. The data used to perform such compensation may be stored in compressed form to reduce memory requirements; however, errors in such compressed data may accumulate unevenly, resulting in loss of image quality.

In another embodiment, if a static image is left for a prolonged period of time on an OLED TV, it suffers from image retention. The result is that once you remove the static image, you would still be able to see a faint outline—or ghosting—of the original image, even when you change the picture content. This called image sticking, image retention, or image ghosting. The same method as stress profile is applied for image sticking.

Thus, there is a need for an improved system and method for stress compensation.

The above information disclosed in this Background section is only for enhancement of understanding of the background of the disclosure and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a system and a method for mitigating the effects of compression errors using Burrows-Wheeler based stress profile or image sticking compression.

In some embodiments, a method of stress compensation in a display includes converting a stress profile for a slice of the display from a first format to a second format based on a conversion ratio; transforming the converted stress profile for the slice of the display, with a first transformation, to form a compressed transformed stress profile; decompressing the compressed transformed stress profile to form a decompressed transformed stress profile; and transforming the decompressed transformed stress profile, with a second transformation, to form a decompressed stress profile, the second transformation being an inverse of the first transformation.

In some embodiments, converting the stress profile for the slice of the display includes dividing each slice into a plurality of sub-slices; and converting each element of content of each sub-slice from the first format to the second format to generate the converted stress profile, wherein in the first format, each element of each sub-slice is a 32 bit number, and in the second format, each element of each sub-slice is divided into four separate bytes, each byte containing 8 bits, wherein the conversion ratio is four to one. In some embodiments, the first transformation is Burrows-Wheeler transform (BWT) and the second transformation is inverse BWT.

In some embodiments, the BWT is applied on each element of each sub-slice after each element of each sub-slice is divided into four separate bytes, each byte containing 8 bits, to generate a transformed stress profile of the slice of the display. In some embodiments, a data compression algorithm is applied on the transformed stress profile of the slice to generate the compressed transformed stress profile. In some embodiments, the data compression algorithm is bzip2.

In some embodiments, transforming the converted stress profile for the slice of the display further includes permuting elements of the transformed stress profile of the slice of the display, with a first permutation, to form a permuted transformed stress profile; and compressing the permuted transformed stress profile to form the compressed transformed stress profile. In some embodiments, transforming the decompressed transformed stress profile includes permuting elements of the decompressed transformed stress profile of the display, with a second permutation, wherein the second permutation is an inverse of the first permutation.

In some embodiments, the first permutation is a circular shift by a constant amount. In some embodiments, the first permutation is a circular shift by a pseudorandom amount. In some embodiments, the first permutation is a circular shift. In some embodiments, transforming the decompressed transformed stress profile, with the second transformation, to form the decompressed stress profile, is based on permuting the elements of the decompressed transformed stress profile of the display. In some embodiments, the method further includes storing the compressed transformed stress profile in a memory.

In some embodiments, a system for performing stress compensation in a display, the system includes a memory; and a processing circuit configured to: convert a stress profile for a slice of the display from a first format to a second format based on a conversion ratio; transform the converted stress profile for the slice of the display, with a first transformation, to form a compressed transformed stress profile; decompress the compressed transformed stress profile to form a decompressed transformed stress profile; and transform the decompressed transformed stress profile, with a second transformation, to form a decompressed stress profile, the second transformation being an inverse of the first transformation.

In some embodiments, the processing circuit is further configured to: divide each slice into a plurality of sub-slices; and convert each element of content of each sub-slice from the first format to the second format to generate the converted stress profile, wherein in the first format, each element of each sub-slice is a 32 bit number, and in the second format, each element of each sub-slice is divided into four separate bytes, each byte containing 8 bits, wherein the conversion ratio is four to one.

In some embodiments, the first transformation is Burrows-Wheeler transform (BWT) and the second transformation is inverse BWT, and wherein the BWT is applied on each element of each sub-slice after each element of each sub-slice is divided into four separate bytes, each byte containing 8 bits, to generate a transformed stress profile of the slice of the display. In some embodiments, a data compression algorithm is applied on the transformed stress profile of the slice to generate the compressed transformed stress profile. In some embodiments, the processing circuit is further configured to: permute elements of the transformed stress profile of the slice of the display, with a first permutation, to form a permuted transformed stress profile; and compress the permuted transformed stress profile to form the compressed transformed stress profile.

In some embodiments, a display includes a display panel; a memory; and a processing circuit configured to: convert a stress profile for a slice of the display from a first format to a second format based on a conversion ratio; transform the converted stress profile for the slice of the display, with a first transformation, to form a compressed transformed stress profile; decompress the compressed transformed stress profile to form a decompressed transformed stress profile; and transform the decompressed transformed stress profile, with a second transformation, to form a decompressed stress profile, the second transformation being an inverse of the first transformation.

In some embodiments, the processing circuit is further configured to: divide each slice into a plurality of sub-slices; and convert each element of content of each sub-slice from the first format to the second format to generate the converted stress profile, wherein in the first format, each element of each sub-slice is a 32 bit number, and in the second format, each element of each sub-slice is divided into four separate bytes, each byte containing 8 bits, wherein the conversion ratio is four to one, wherein the first transformation is Burrows-Wheeler transform (BWT) and the second transformation is inverse BWT, and wherein the BWT is applied on each element of each sub-slice after each element of each sub-slice is divided into four separate bytes, each byte containing 8 bits, to generate a transformed stress profile of the slice of the display.

BRIEF DESCRIPTION OF THE DRAWINGS

These and other features of some example embodiments of the present disclosure will be appreciated and understood with reference to the specification, claims, and appended drawings, wherein:

FIG. 3 illustrates an example stress table for a display panel, according to some example embodiments of the present disclosure;

FIG. 6A-6C illustrate permutation, according to some example embodiments of the present disclosure.

DETAILED DESCRIPTION

Figure 1:
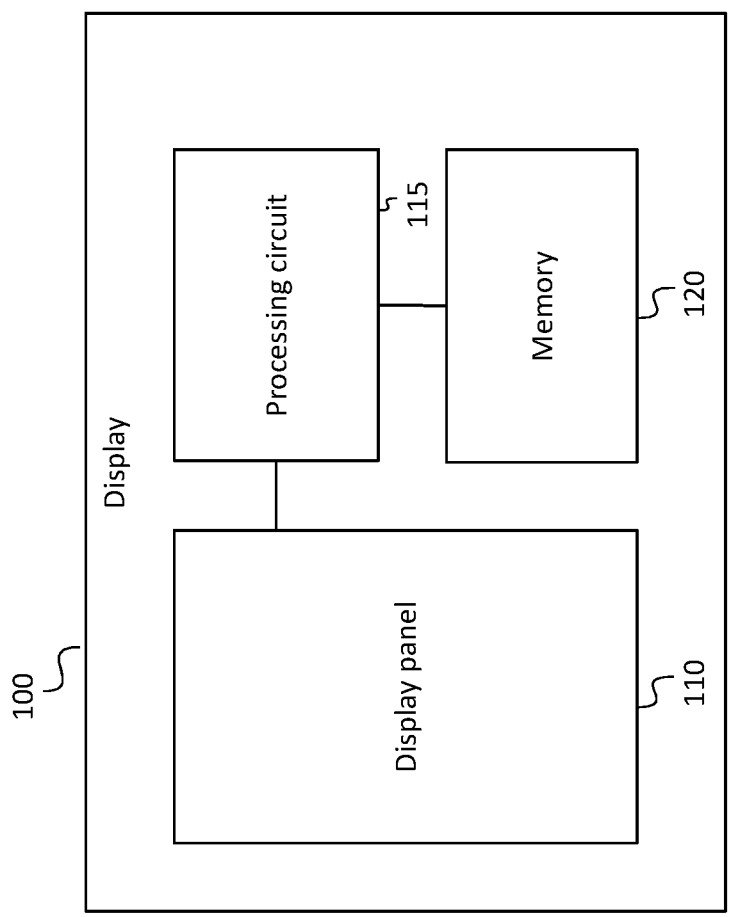
FIG. 1 illustrates an example embodiment of a display, according to some example embodiments of the present disclosure.

The detailed description set forth below in connection with the appended drawings is intended as a description of some example embodiments of a system and a method for mitigating the effects of compression errors using Burrows-Wheeler based stress profile or image sticking compression provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Certain kinds of video displays may have characteristics that change with use. For example, an organic light-emitting diode (OLED) display may include a display panel having a plurality of pixels, each consisting of several subpixels (e.g., a red subpixel, a green subpixel, and a blue subpixel), and each of the subpixels may include an organic light-emitting diode configured to emit a different respective color. Each organic light-emitting diode may have an optical efficiency that declines with use, so that, for example, after the organic light-emitting diode has been in operation for some time, the optical output at a certain current may be lower than it was, at the same current, when the organic light-emitting diode was new.

This reduction in optical efficiency may result in dimming of parts of a display panel that have on average, during the life of the display, displayed brighter portions of the displayed images than other parts of the display. For example, a display used to view largely unchanging images from a security camera, the field of view of which contains a scene having a first portion which is sunlit, and relatively bright, during most of the day, and a second portion which is in the shade and relatively dim, during most of the day, may eventually show a more significant decrease in optical efficiency in the first portion than in the second portion. The fidelity of image reproduction of such a display may degrade over time as a result. As another example, a display that is used part of the time to display white text at the bottom of the image, separated by a black margin from the rest of the image, may experience a lower reduction of optical efficiency in the black margin than in other parts of the display panel, so that if the display is later used in a mode in which a scene fills the entire display panel, a brighter band may appear where the black margin was previously displayed (image sticking).

To reduce the effect of such non-uniformities in the optical efficiency of a display, a display may include features to compensate for the reduction of optical efficiency resulting from use of the display.

FIG. 1 illustrates an example embodiment of a display 100. Display 100 may include a display panel 110, a processing circuit 115, and a memory 120. The contents of the memory 120 may be referred to as a "stress profile" or "stress table" for the display 100. The "stress profile" or "stress table" stored on the memory 120 may be a table of numbers or "stress values" indicating the amount of stress each sub-pixel in the display 100 has been subjected to during the life of the display 100. The "stress" may be the total (e.g., time-integrated) drive current that has flowed through each sub-pixel during the life of the display 100. For example, the "stress" may be the total charge that has flowed through each sub-pixel during the life of the display 100.

In some example embodiments, the method of determining the "stress profile" may be a data driven method to compensate for OLED output decline. In some example embodiments, in order to determine the "stress profile" of the display 100, the memory 120 may accumulate one number for one or some sub-pixels, each time a new image is displayed in the display 100 as a new entry in the "stress profile" or "stress table" for the display 100. For example, as a continuous stream of images together form displayed video in the display 100, the drive current for each sub-pixel in each image may be measured and a number indicating the current or brightness of the subpixel may be added to the respective number or "stress" for that sub-pixel in "stress profile" or stress table" in the memory 120.

In some example embodiments, a display 100 having a timing controller and a plurality of driver integrated circuits, the processing circuit may be, or may be part of, one or more of the driver integrated circuits. In some embodiments, each driver integrated circuit is responsible for driving a portion of the display panel, and it may accordingly perform stress accumulation and stress compensation for that portion, independently of the other driver integrated circuits.

In some example embodiments, during operation of the display 100, the drive current to each sub-pixel may be adjusted to compensate for an estimated loss of optical efficiency. The estimated loss of optical efficiency may be based on the lifetime stress of the sub-pixel. For example, the drive current to each sub-pixel may be increased in accordance with (e.g., in proportion to) the estimated loss of optical efficiency of the sub-pixel (e.g., as accumulated in the memory 120), so that the optical output of the sub-pixel may be substantially the same as it would have been had the optical efficiency of the sub-pixel not been reduced, and had the drive current not been increased. In some example embodiments, a non-linear function based on empirical data or a model of the physics of the sub-pixel may be used to infer or predict the loss of optical efficiency expected to be present, based on the lifetime stress of the sub-pixel. The calculations of the predicted loss of optical efficiency, and of the accordingly adjusted drive current, may be performed by the processing circuit 115. In some embodiments, the calculations are stored in a look up table in the memory and the processing circuit 115 may use it for compensation. In some example embodiments, during operation of the display 100, the drive current to each sub-pixel may be adjusted according to a compensation factor, which may be calculated based on an accumulated brightness captured from output image of the sub-pixel.

Figure 2A:
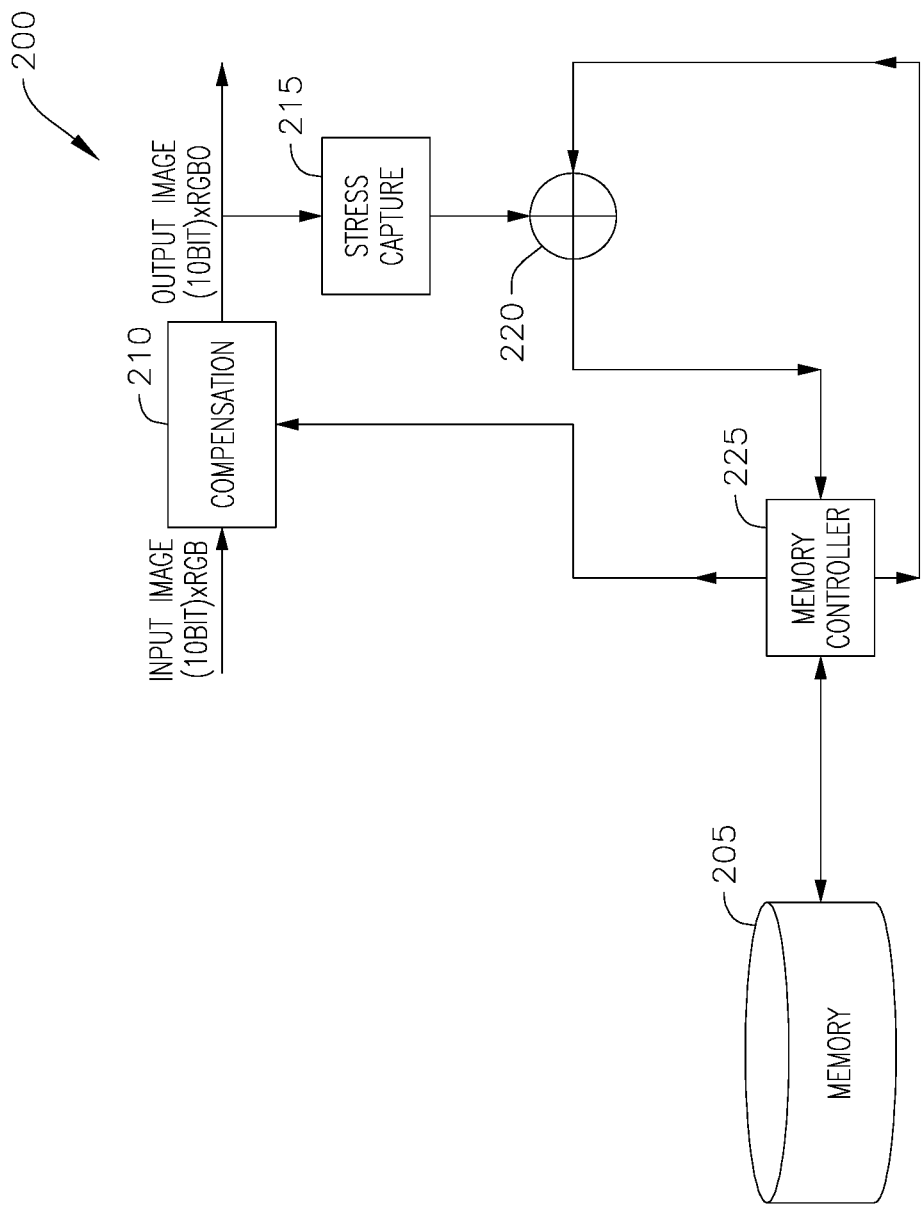
FIG. 2A illustrates a block diagram of an example embodiment of a system for stress compensation, according to some example embodiments of the present disclosure.

FIG. 2A illustrates a block diagram of an example embodiment of a system 200 for stress compensation. The system 200 includes a memory 205, a compensation module 210, a stress capture module 215, an adding circuit 220, and a memory controller 225. The stress table is stored in the memory 205. In operation, stress values in the stress table may be accessed (e.g., read out) via the memory controller 225 and may be used by the compensation module 210 to determine compensation factors for the sub-pixels. The compensation module 210 may include a drive current adjustment circuit to calculate adjusted drive current values for each sub-pixel based on the respective compensation factor of that sub-pixel. The compensation factor for each sub-pixel is based on the stress value of that sub-pixel. In some example embodiments, the adjusted drive current value for each sub-pixel may be a raw drive current value (e.g., based on the desired optical output of the sub-pixel), adjusted according to the accumulated stress of the sub-pixel. The adjusted drive current value for each sub-pixel is read by the stress capture module 215, which may include a sub-pixel stress sampling circuit. The adjusted drive current value for each sub-pixel represents the current rate of accumulation of stress of the sub-pixels being displayed. Each previously stored (e.g., in the memory 205) stress value for each sub-pixel is increased (or "augmented") in an adding circuit 220 based on the current rate of accumulation of stress (e.g., by a number proportional to the adjusted drive current value), and saved back to the memory 205 via the memory controller 225. The memory controller 225 controls read and write operations in the memory 205 and feeds the stress values from the memory 205 to the drive current adjustment circuit of the compensation module 210 and to the adding circuit 220 as needed. The memory controller 225 also stores the augmented stress values, which have been augmented by the addition of the current rate of accumulation of stress at the adding circuit 220, back into memory 205.

In some example embodiments, tracking the total stress of each sub-pixel may require a significant amount of memory. For example, for a display with 1920×1080 pixels, with three sub-pixels per pixel, and with the stress of each sub-pixel stored in a few byte numbers, the size of the memory required may be in the order of tens of megabytes. Moreover, the computational burden of updating each stress number for each sub-pixel for each frame of video (e.g., for each displayed image) is significant.

Various approaches may be used to reduce the burden of tracking, and correcting for the reduction in optical efficiency resulting from, sub-pixel stress. For example, the sub-pixel stress sampling circuit in the stress capture module 215 may sample only a subset of the adjusted drive current values in each image (e.g., in each frame of video). For example, in a display having 1080 lines (or rows) of pixels, if the scene changes relatively slowly in the video being displayed, only one row of the stress table is updated per frame of video. The discarding of the intervening 1079 adjusted drive current values for any sub-pixel may result in only a small, acceptable loss of accuracy in the resulting stress values (e.g., as a measure of the lifetime stress value)

of the sub-pixel. In another embodiment, the sub-pixel stress sampling circuit in the stress capture module 215 may in addition sample only at subset of frames. For example, in a display having 1080 lines (or rows) with refresh rate of 60 Hz (e.g., showing 60 frames per minute), the stress sampling circuit in the stress capture module 215 samples all or partial drive current values in the image once every 10 frames and the stress table is updated accordingly.

Various approaches may also be used to reduce the memory size required for storing sub-pixel stress in the stress table. For example, the memory on the stress profile chipset may be reduced by compressing the data stored in the memory.

Figure 2B:
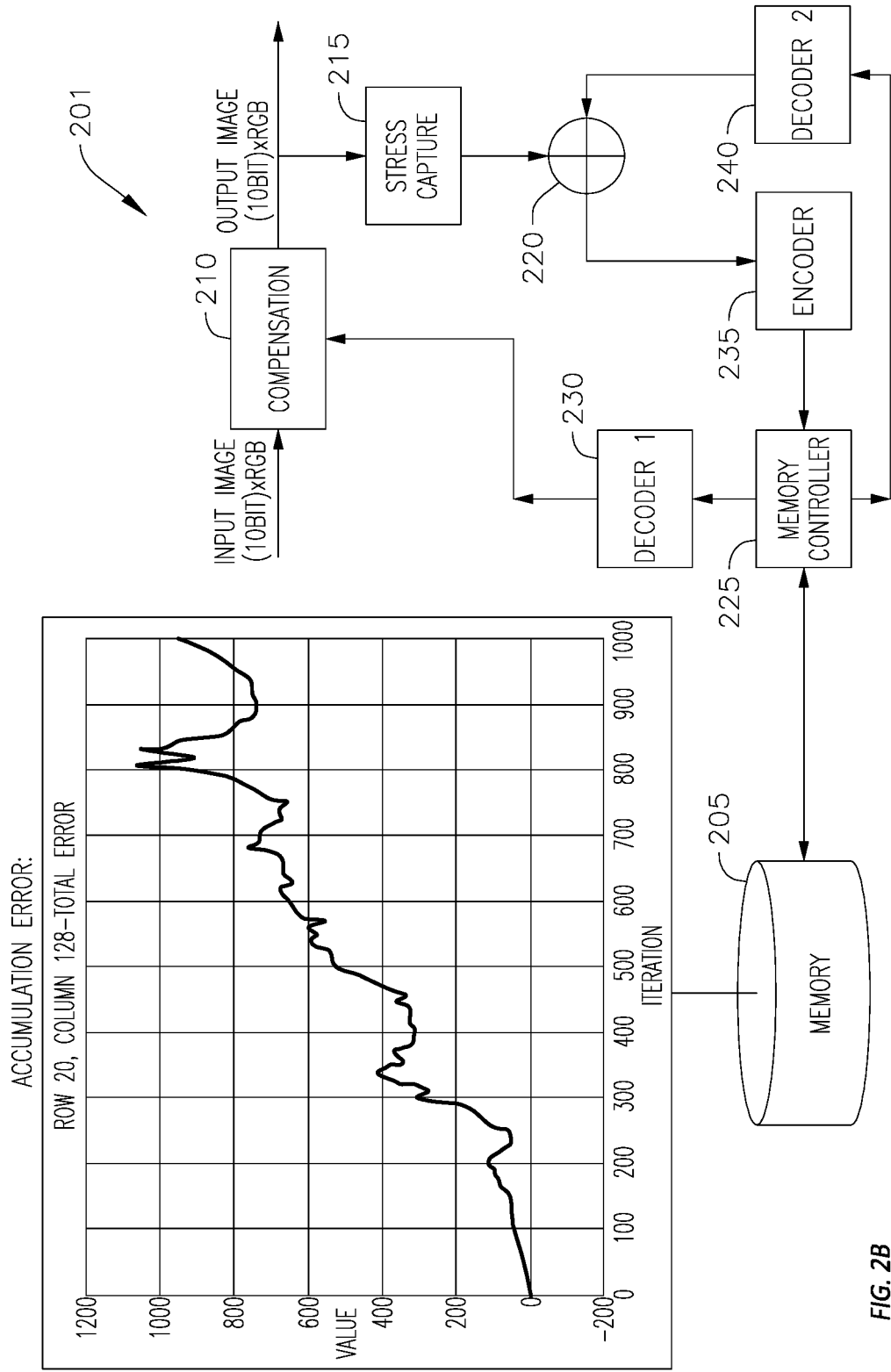
FIG. 2B illustrates a block diagram of an example embodiment of a system for stress compensation using memory compression, according to some example embodiments of the present disclosure.

FIG. 2B illustrates a block diagram of an example embodiment of a system 201 for stress compensation using memory compression. The system 201 includes all the components of FIG. 2A. The system 201 also includes a first decoder 230, an encoder 235, and a second decoder 240. In some example embodiments, a compressed representation of the stress table is stored in the memory 205. In operation, compressed stress data may be accessed (e.g., read out) via the memory controller 225 and may be decompressed by the first decoder 230 before being fed to the drive current adjustment circuit of the compensation module 210. The drive current adjustment circuit of the compensation module 210 calculates the adjusted drive current values for each sub-pixel based on the respective compensation factor of that sub-pixel. The compensation factor for each sub-pixel is based on the stress value of that sub-pixel. The adjusted drive current value for each sub-pixel is read by the stress capture module 215. The adjusted drive current value for each sub-pixel represents the current rate of accumulation of stress of the sub-pixels being displayed. The compressed stress data in the memory 205 are also decompressed by a second decoder 240 to retrieve each previously stored (e.g., in the memory 205) stress value for each sub-pixel. The decompressed stress values for the sub-pixel from the second decoder 240 are sent to the adding circuit 220. Each previously stored stress value for each sub-pixel is increased (or "augmented") in the adding circuit 220 based on the current rate of accumulation of stress (e.g., by a number proportional to the adjusted drive current value). The augmented stress values from the adding circuit 220 are encoded, or compressed, by an encoder 235 before being stored in the memory 205. The encoder 235 encodes data that it receives in a manner that compresses the data. Each of the first decoder 230 and the second decoder 240 decompresses the received data. For example, each of the first decoder 230 and the second decoder 240 performs an operation that inverts, or approximately inverts, the operation performed by the encoder 235. Accordingly, "coding" and "compressing" (and related words, such as "encoding" and "encoded", and "compressed", respectively) are used interchangeably herein, as are "decoding" and "decompressing" (and related words, such as "decoded" and "unencoded", and "decompressed" and "uncompressed", respectively). Various methods of compression may be employed, including entropy coding, such as Huffman coding or arithmetic coding.

The system 201 of FIG. 2B may reduce the memory size required for storing sub-pixel stress in the stress table. However, due to the iterative nature of the system, errors can accumulate in the memory or the stress table, compared to a system (e.g., 200) which does not use compression.

FIG. 3 illustrates an example uncompressed stress table 300 for a display panel. The stress table 300 may be stored in a memory. The display panel may be the display panel 110 of FIG. 1 and the memory may be the memory 205 of FIGS. 2A and 2B that stores the stress table 300 in uncompressed or compressed mode.

The burden of tracking, and correcting for, sub-pixel stress may also (or instead) be reduced by averaging the data stored in the memory. For example, as illustrated in FIG. 3, in some embodiments, each entry in the stress table, instead of representing the accumulated stress of a single sub-pixel, represents a function of the respective stresses experienced by a block (e.g., a 4×4 block, as shown) of pixels or sub-pixels. For example, the stress table entry storing the data for a 4×4 block may store the average (or any other function), over the 4×4 block, of the luminance values of the pixels, or it may store the average of the red, green, and blue components. For example, the stress table entry storing the data for a 4×4 block may store the average of the stress of all of the 48 sub-pixels in the 4×4 block, or three elements of the stress table may store respective averages (or any other function), over the 4×4 block, of the red, green, and blue pixels in the 4×4 block.

Figure 4:
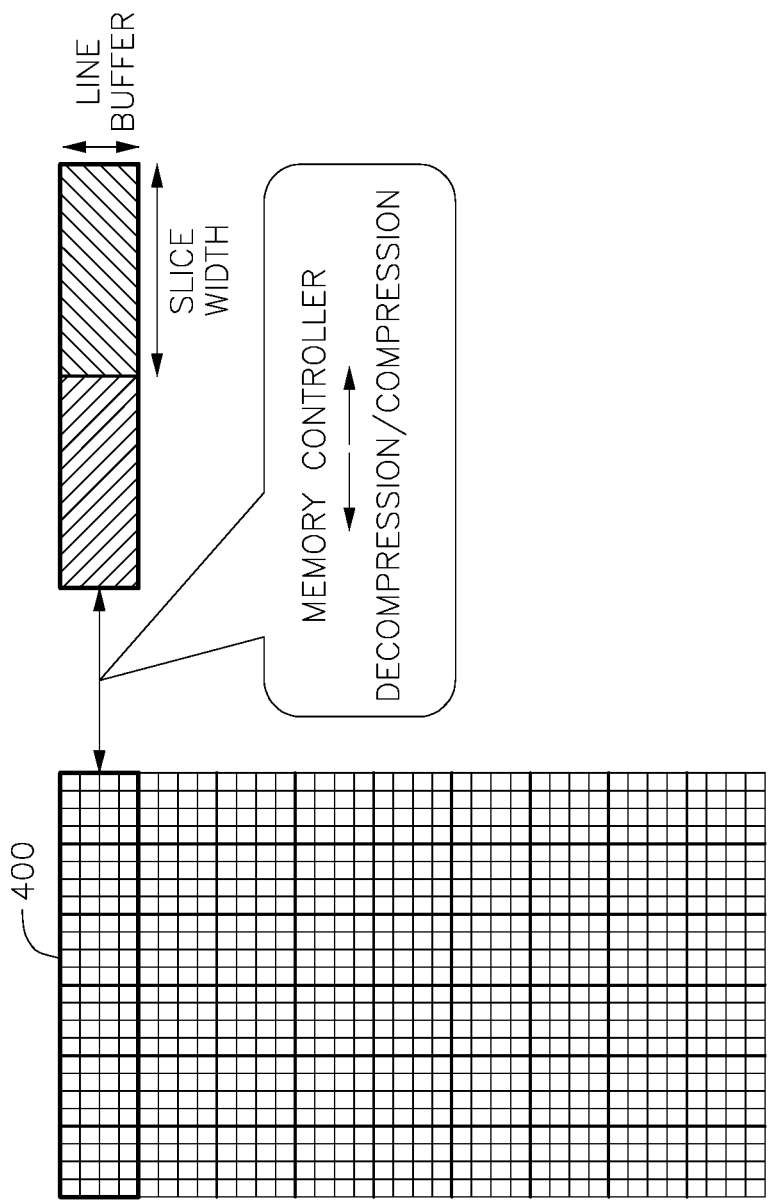
FIG. 4 illustrates an example stress table for a display pane, according to some example embodiments of the present disclosure.

FIG. 4 illustrates an example uncompressed stress table 400 for a display panel. The stress table 400 may be compressed before storing in a memory to reduce the memory size required for storing sub-pixel stress in the stress table. The display panel may be the display panel 110 of FIG. 1 and the memory that stores the compressed version of the stress table 400 may be memory 205 of FIG. 2B.

In one embodiment, for the compression procedure, the uncompressed stress table 400 may be compressed as a whole by the encoder 235 in FIG. 2B at each iteration of the procedures. The compressed stress table is stored in memory 205. Then, the decoders 230 and 240 decompress the memory content of the memory 205 as a whole to create the stress table 400 at each iteration.

In another embodiment, the uncompressed stress table 400 is divided into multiple slices and each slice is compressed or decompressed independently. At each iteration, one slice of height "Line Buffer" is selected, starting from the beginning of the stress table 400, up to the end of the stress table 400 for compression or decompression. The slice height can be as low as 1 and as large as the whole stress table height.

The stress table data may be encoded and decoded in blocks referred to herein as "slices", each of which may in general be in arbitrary subset of the stress table 400. In some example embodiments, each slice corresponds to a square or rectangular region of the stress table 400, and to a square or rectangular region of the display panel (e.g., 110). The square or rectangular region of the display panel (e.g., 110) may be referred to as a slice of the display, and the corresponding slice of the stress table data may be referred to as the stress profile of the slice of the display. Unless otherwise specified, a "slice", as used herein, refers to a slice of the uncompressed stress profile. The horizontal dimension of the region of the display panel (e.g., 110) to which a slice corresponds may be referred to as the "slice width" and the vertical dimension may be referred to as the "line buffer" or "slice height". For example, as illustrated in FIG. 4, a slice may correspond to 4 lines and half of the stress table width.

The size of the region of memory allocated to store the compressed representation of each slice may be fixed or variable based on the compression algorithm used. In some embodiments, the size of the region of memory allocated to store the compressed representation of each slice may be fixed and selected based on an estimated compression ratio for the coding method used. The compression ratio achieved in operation may vary, however, depending on, for example, the extent to which symbols are repeated in the uncompressed data. When the compression ratio achieved in operation is not sufficiently high to allow the compressed slice to fit within the region of memory allocated to store the compressed representation of the slice, the raw data may be truncated before compression is performed. For example, one or more of the least-significant bits of each data word may be removed before compression is performed. The raw data may be truncated before compression to reduce the size, in memory, of the compressed representation of the slice, so that it will fit within the region of memory allocated to storing the compressed representation of the slice. In some embodiments, the required memory length may be calculated to cover the worst case scenario. In another embodiment, the length of compressed representation may be a variable and may be stored in a Table or may be appended to the compressed data.

In some example embodiments, a decompressed representation of a slice of the stress table 400, after compression and decompression, may differ from the uncompressed representation of the slice (e.g., before being compressed), due to compression and decompression errors. For example, compression and decompression errors may occur if a lossy compression is used. In some embodiments, if truncation is performed, as described above, then, compression and decompression errors may occur even if a lossless compression method (e.g., Huffman coding or arithmetic coding) is employed. If the stress data of a slice are decompressed before being augmented and then compressed again in the same manner each time the stress data are augmented with newly sampled adjusted drive current values, then such discrepancies may accumulate disproportionately in some data words. Accordingly, it may be advantageous to employ measures to counter such uneven accumulation of errors due to truncation, to reduce the likelihood that the accumulated errors will cause unacceptable or overcompensation of image quality.

In some example embodiments, it is shown that sorting would improve the compression performance as similar values would be beside each other. However, the problem is de-sorting, as the index of the pixels after sorting should be kept to return the sorted stream back to what it was before. This requires more memory than what may have been saved with compression. In addition, sorting performance for compression with stress table data of a display panel is lower than sorting performance for text or image compression due to the nature of iterative accumulation of values in the stress table. The memory content values are huge and usually the corresponding pixel values in the memory in one slice have huge differences. Even though stress table data or the pixel values in the memory are sorted, it is unlikely that many similar values are neighbors, which may defeat the purpose of sorting.

In order to have lower compression errors and have a more uniform compression error, Burrows-Wheeler transform (BWT) may be applied to each slice of the stress table (e.g., stress table 300 or 400) before applying compression technique. For example, BWT may be applied to each slice of the stress table before the augmented stress values from the adding circuit 220 are encoded, or compressed, by an encoder 235, before being stored in the memory 205, as shown in FIG. 2B. BWT is a one-to-one transformation that outputs the last column of a square matrix formed by lexicographic sorting of all the cyclic shifts of the original sequence. BWT is not the same as sorting but it is an invertible transform that tends to put runs of the same values together which makes compression works better. In addition, BWT randomizes the input stream for compression, by distorting the regular pattern of the image, even though keeping some correlation by grouping similar values for compression. It is shown that BWT would improve the compression performance as it tends to put runs of the same pixels values together.

Figure 5A:
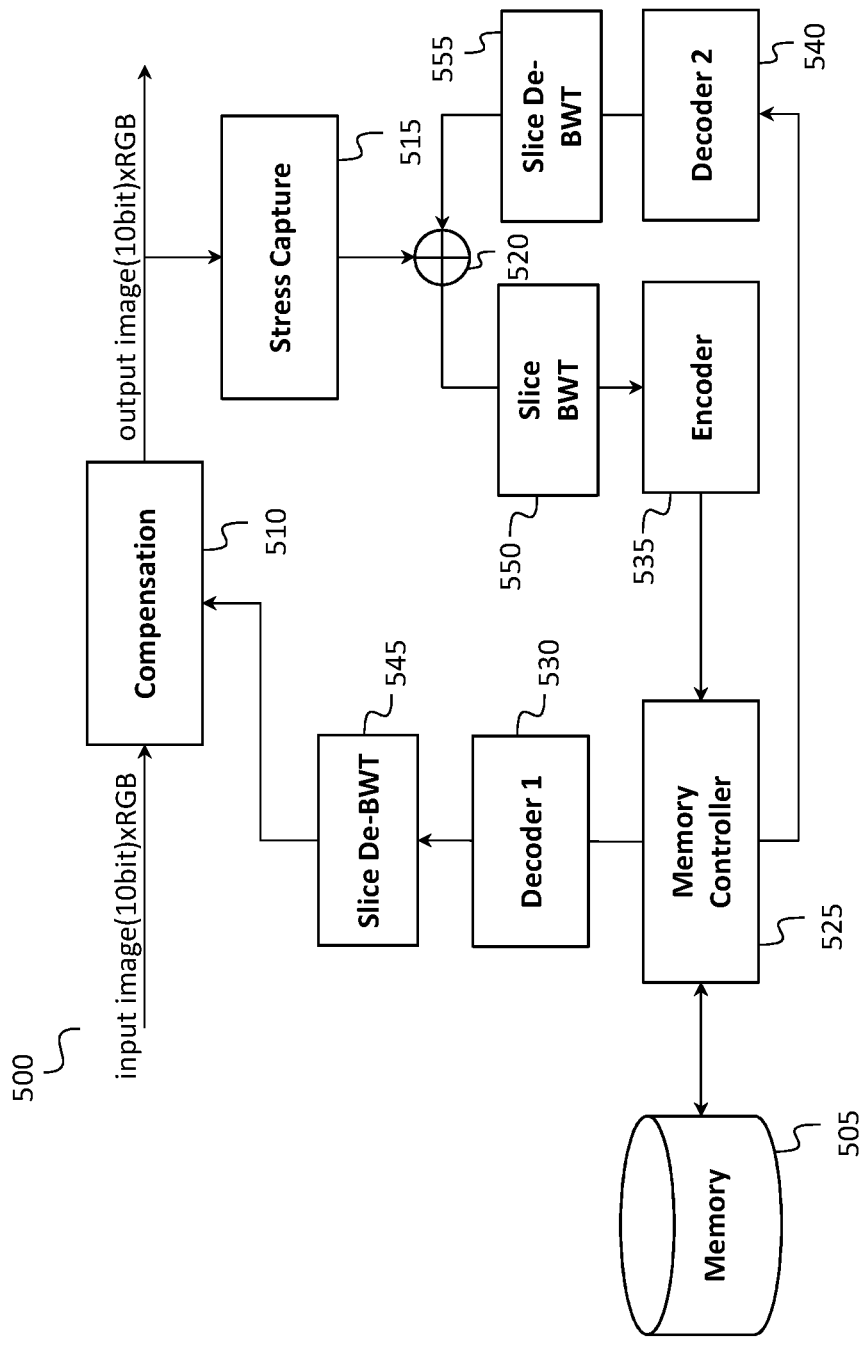
FIG. 5A illustrates a block diagram of an example embodiment of a system for stress compensation using memory compression, according to some example embodiments of the present disclosure.
Figure 5B:
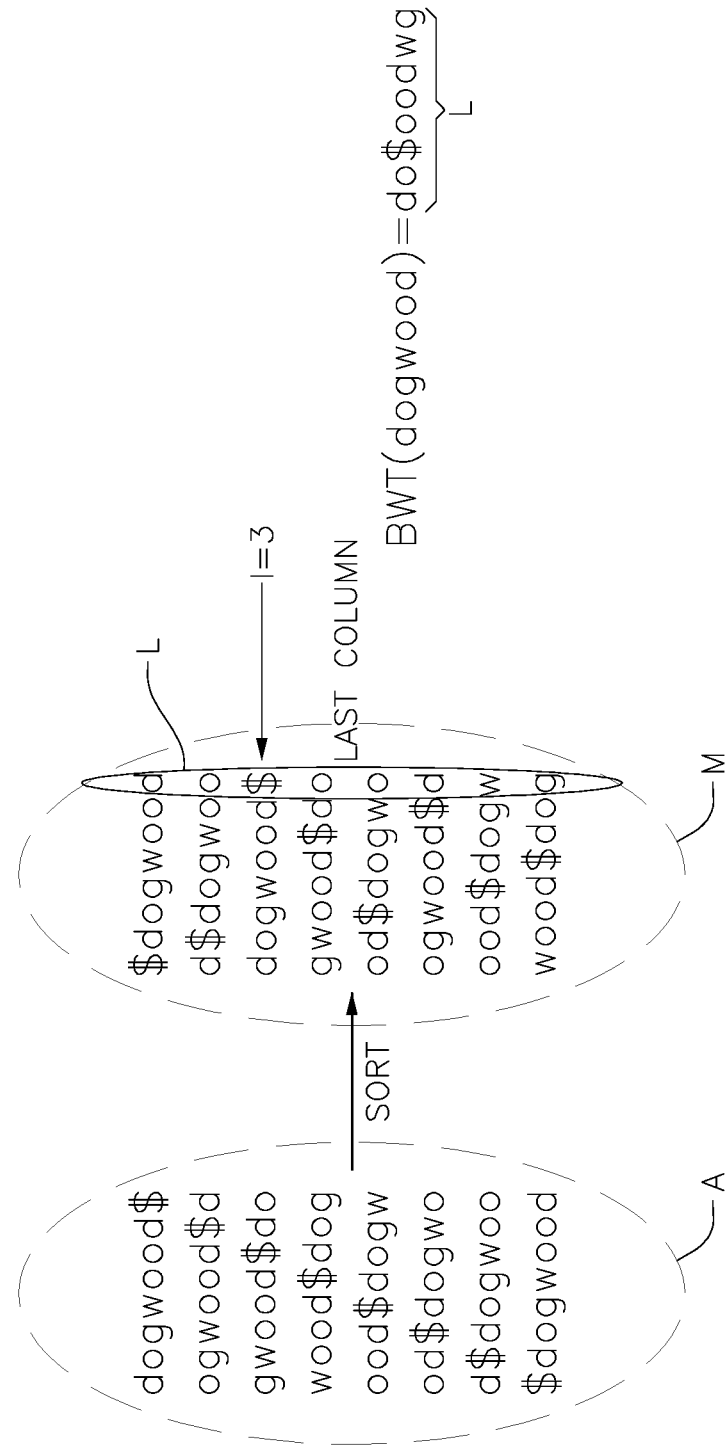
FIG. 5B illustrates an example implementation of Burrows-Wheeler transform (BWT), according to some example embodiments of the present disclosure.
Figure 5C:
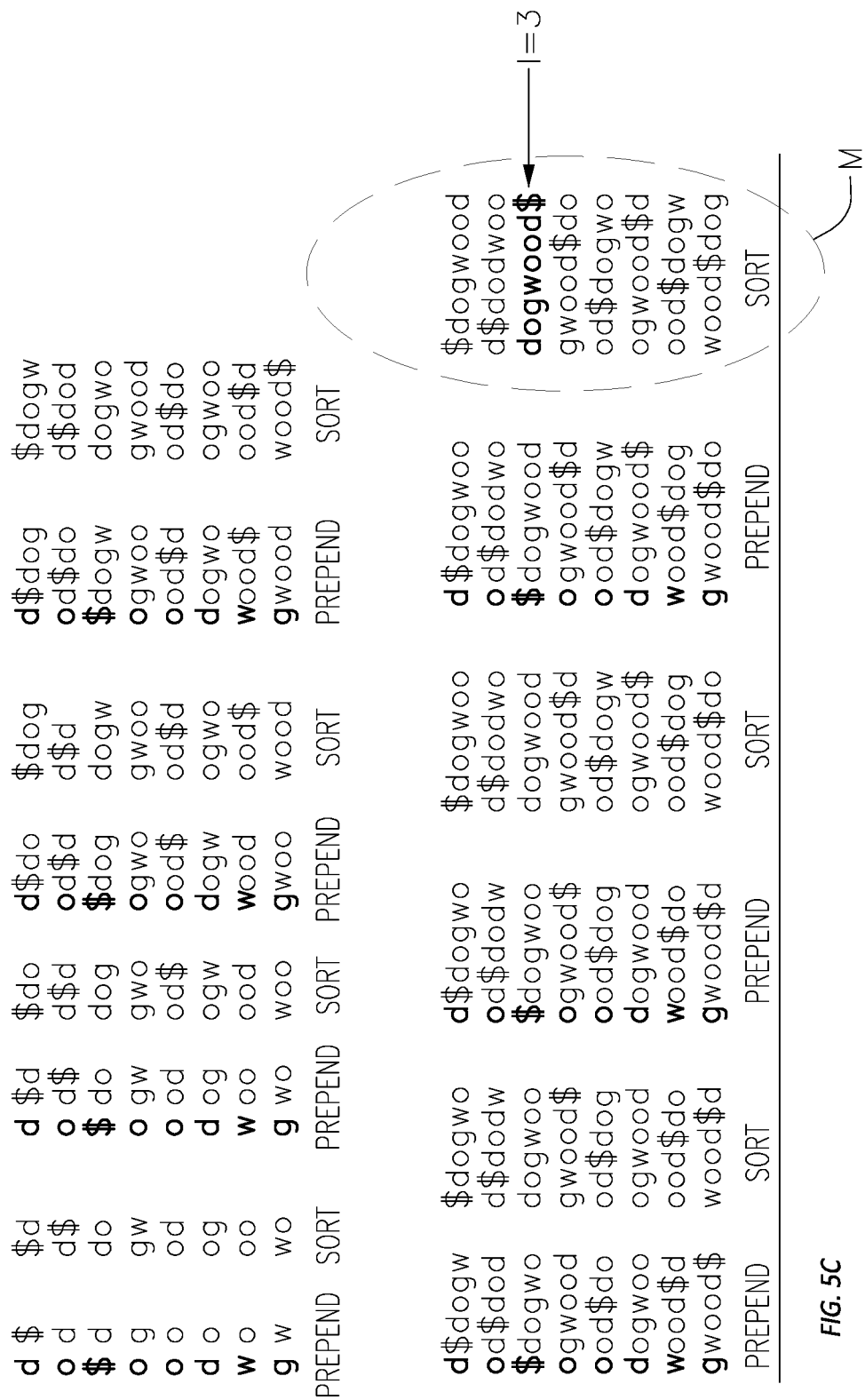
FIG. 5C illustrates an example implementation of inverse BWT, according to some example embodiments of the present disclosure.

FIG. 5A illustrates an example block diagram of a system 500 for implementing BWT for stress compensation using memory compression. FIG. 5B illustrates an example of how BWT algorithm works on a string S=dogwood of 7 characters. FIG. 5C illustrates an example implementation of inverse BWT on the result (e.g., string L=do$oodwg) of the implementation of BWT on string S to recover the original string S.

The system 500 includes a memory 505, a compensation module 510, a stress capture module 515, an adding circuit 520, a memory controller 525, a first decoder 530, an encoder 535, and a second decoder 540. The system 500 also includes a first slice de-BWT circuit 545, a slice BWT circuit 550, and a second slice de-BWT circuit 555. The system 500 of FIG. 5A therefore includes all the components of system 201 of FIG. 2B and the circuits (e.g., 545, 550, and 555) for implementing BWT and inverse BWT in the method of stress compensation using memory compression as described with respect to FIG. 2B.

In system 500, the components 505, 510, 515, 520, 525, 530, 535, and 540 may perform the same task as the components 205, 210, 215, 220, 225, 230, 235, and 240. For example, a compressed representation of the stress table is stored in the memory 505. In operation, compressed stress data may be accessed (e.g., read out) via the memory controller 525 and may be decompressed by the first decoder 530. The drive current adjustment circuit of the compensation module 510 calculates the adjusted drive current values for each sub-pixel based on the respective compensation factor of that sub-pixel. The compensation factor for each sub-pixel is based on the stress value of that sub-pixel. The adjusted drive current value for each sub-pixel is read by the stress capture module 515. The adjusted drive current value for each sub-pixel represents the current rate of accumulation of stress of the sub-pixels being displayed. The compressed stress data in the memory 505 are also decompressed by a second decoder 540 to retrieve each previously stored (e.g., in the memory 505) stress value for each sub-pixel. Each previously stored stress value for each sub-pixel is passed through the slice de-BWT 555 and then is increased (or "augmented") in the adding circuit 520 based on the current rate of accumulation of stress (e.g., by a number proportional to the adjusted drive current value). The augmented stress values from the adding circuit 520 are passed through slice BWT 550 and then encoded, or compressed, by an encoder 535, before being stored in the memory 505. The encoder 535 encodes data that it receives in a manner that compresses the data. Each of the first decoder 530 and the second decoder 540 decompresses the received data. For example, each of the first decoder 530 and the second decoder 540 performs an operation that inverts, or approximately inverts, the operation performed by the encoder 535.

In system 500, the slice BWT circuit 550 may divide each slice of stress profile into a plurality of sub-slices, where the BWT algorithm is implemented on each sub-slice. The content of a sub-slice may be 32 bit numbers. The slice BWT circuit 550 may then separate each 32 bit number in the sub-slice into four separate bytes, each byte having 8 bits, assuming the conversion ratio is four to one. However, other conversion ratios may be used. For example, if the conversion ratio is two to one, each 32 bit number in the sub-slice may be separated into 2 separate words, each word having 16 bits. The content of the sub-slice may form a conceptual matrix 570 where each 32 bit number in the matrix of the sub-slice is separated into four separate bytes. The slice BWT circuit 550 may then convert the newly formed matrix 570 of the newly formatted contents of the sub-slice into a vector 575. Each sub-slice of the slice of the stress profile may be processed similarly, at the same time or sequentially, before applying BWT on each sub-slice.

The slice BWT circuit 550 applies a BWT 580 to the newly formatted (from 32 bits to four separate bytes) stress data vectors 575 of the slice to generate a transformed stress profile of the slice. The transformed stress profile of the slice is then encoded by the encoder 535 to form a compressed transformed stress profile of the slice. After any compressed slice or any compressed transformed stress profile of a slice is decoded by the first decoder 530, the first slice de-BWT circuit 545 applies a first inverse BWT to the output of the first decoder 530, the first inverse BWT being an inverse of the first BWT so that the output of the first slice de-BWT circuit 545 is the same as, or nearly the same as (differing, for example, by discrepancies resulting from truncation, as discussed above), the uncompressed slice data that were processed by the slice BWT circuit 550 and by the encoder 535 to form the compressed slice. Similarly, after any compressed slice or any compressed transformed stress profile of a slice is decoded by the second decoder 540, a second slice de-BWT circuit 555 applies the second inverse BWT to the output of the second decoder 540, so that the output of the second slice de-BWT circuit 555 is the same as, or nearly the same as, the uncompressed slice data that were processed by the slice BWT circuit 550 and by the encoder 535 to form the compressed slice.

Referring to FIG. 5B, an example implementation of BWT on a string S=dogwood of 7 characters is illustrated (a $ sign is added to the end of the string for the BWT algorithm). BWT is applied in data compression techniques such as bzip2. The idea of BWT is to apply a reversible transformation to a block of text to form a new block that contains the same characters, but is easier to compress by simple compression algorithms. The transformation tends to group characters together so that the probability of finding a character close to another instance of the same character is increased substantially. Text of this kind can easily be compressed with fast locally-adaptive algorithms, such as move to front coding (MTF) in combination with Huffman or arithmetic coding. For example, BWT transforms a string S of N characters (including a $ sign as representing the end of the string) by forming the N rotations (cyclic shifts) of S, sorting them lexicographically, and extracting the last character of each of the rotations. A string L is formed from these characters, where the i-th character of L is the last character of the i-th sorted rotation. In addition to L, the algorithm computes the index I of the original string S in the sorted list of rotations. The inverse BWT algorithm may be used to compute the original string S given only L and I.

BWT algorithm takes as input a string S of N characters S[0], . . . , S[N−1] selected from an ordered alphabet X of characters. A conceptual N×N matrix M is formed whose elements are characters, and whose rows are the rotations (cyclic shifts) of S, sorted in lexicographical order. At least one of the rows (e.g., row 3 of M in FIG. 5B) of M contains the original string S. I may be the index of the first such row. Therefore, in the example of FIG. 5B, 1=3.

FIG. 5B illustrates the technique, using the string S=dogwood$, N=8, and the alphabet X={$, d, g, o, w}. In string S a special character $ is added at the end of the text dogwood, where the special character $ is smaller than any other text characters. In some embodiments, a conceptual 8×8 matrix M is formed whose elements are characters, and whose rows are the rotations (cyclic shifts) of the string S=dogwood$, sorted in lexicographical order. In the example of FIG. 5B, matrix "A" is formed by cyclic shifts (e.g., N=8 rotations) of the string S=dogwood$ and matrix M is formed by lexicographically sorting the elements of matrix A. In FIG. 5B, third row of M contains the original string S and I is the index of the first such row (e.g., if it is from zero, 1=2). Therefore, in the example of FIG. 5B, 1=3. The string L is the last column of M and the output of the transformation is L. In the example of FIG. 5B, L=do$oodwg.

FIG. 5C illustrates an example of reverse BWT to compute the original string S=dogwood$ given only L=do$oodwg. In order to compute the original string S using inverse BWT, N−1 or 7 iterations may be performed. For example, during the first iteration, string L=do$oodwg forms the first column of the first prepend matrix. The second column of the first prepend matrix is formed by lexicographically sorting the elements of the first column of the first prepend matrix. During the first iteration, the first sort matrix is formed by lexicographically sorting the rows of the first prepend matrix. During the send iteration, string L=do$oodwg forms the first column of the send prepend matrix and the first sort matrix forms the send and third column of the send prepend matrix. The second sort matrix is formed by lexicographically sorting the rows of the second prepend matrix. In the example for FIG. 5C, the inverse BWT algorithm continues in a similar matter for N−1=7 iterations and at the end of 7th iteration the seventh sort matrix is formed. The seventh sort matrix is same as matrix M whose third row indicates the original string S=dogwood$, in which $ sign is at the end.

In some example embodiments, the contents of the memory (e.g., 505) that stores the stress table for a display panel (e.g., 110) are 32 bit numbers because of the accumulation of brightness of the pixels in the memory over a long period of time. Implementing sorting or BWT over 32 bits memory contents may result in poor performance compared to the performance expected from BWT. When implementing BWT on 32 bits numbers, the likelihood of similar values being neighbors decreases significantly. This may defeat the purpose of sorting or implementing BWT on the 32 bit stress table data.

In some example embodiments, treating each 32 bit number in the memory (e.g., 505) as four separate bytes (8 bits) and implement BWT on the memory contents assuming each slice include bytes may improve efficiency of the BWT when implementing on the 32 bit numbers.

Figure 5D:
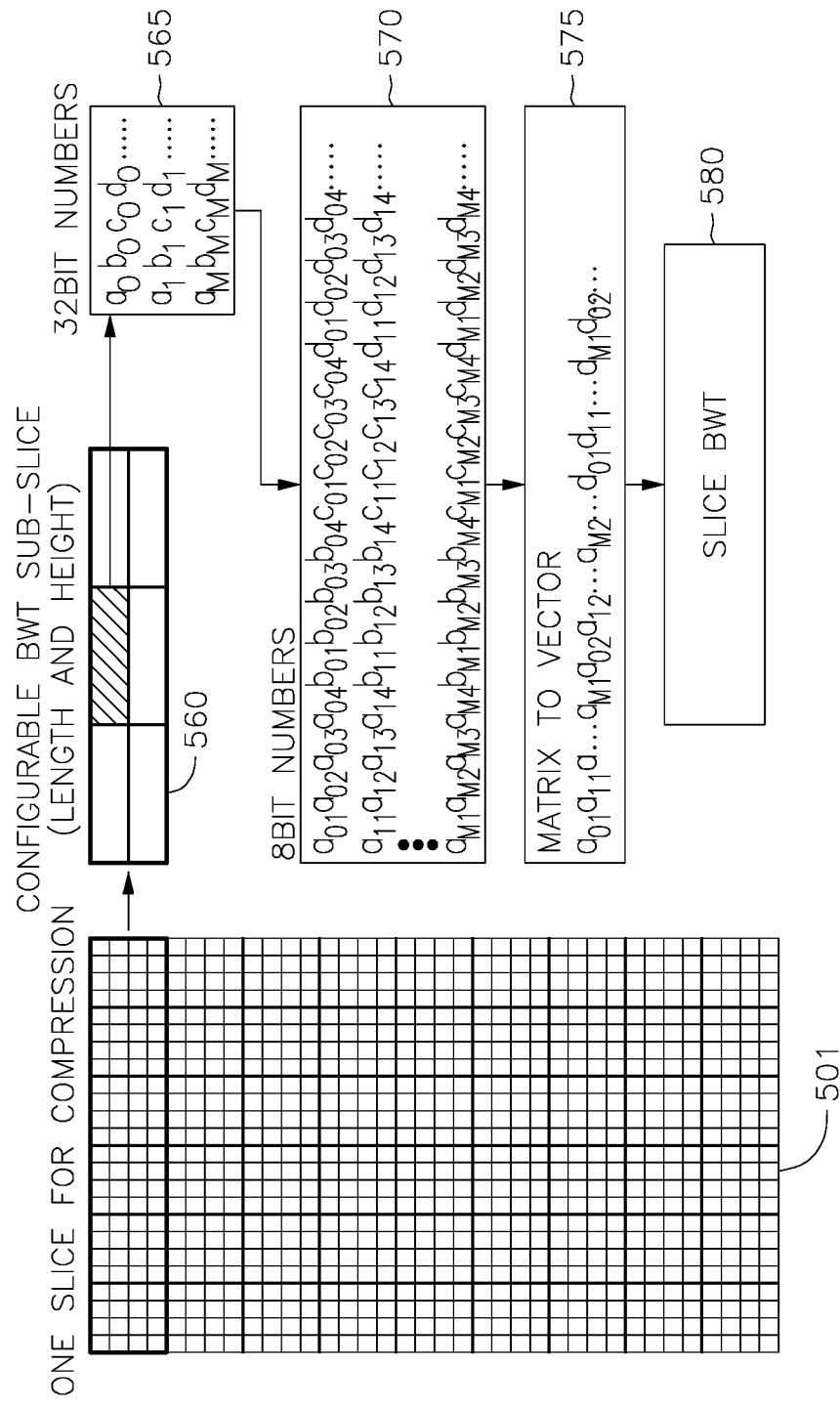
FIG. 5D illustrates an example implementation of BWT, according to some example embodiment of the present disclosure.

FIG. 5D illustrates an example where BWT is implemented on a 32 bit memory content (e.g., stress table data stored on memory 505 for the display panel 110) by treating each 32 bit number in the memory (e.g., 505) as four separate bytes (8 bits) and implement BWT on the memory contents assuming each slice includes bytes. As shown in FIG. 5D, each slice 560 of the memory content 501 may be divided into a plurality of sub-slices, where the contents of a sub-slice 565 may be 32 bit numbers. The length and height of each sub-slice may vary depending on the application and selected/optimized arbitrary. In FIG. 5D, the contents of the sub-slice 565 is represented as a matrix, where each element of the matrix is a 32 bit number. The matrix size is the same size as the sub-slice size. Though each pixel in the sub-slice has three components, meaning there are three matrices per each sub-slice which need to go through the BWT circuit. In another embodiment, the stress table for each sub-pixel in the sub-slice can be concatenated and BWT circuit is implemented on the big matrix.

If BWT is applied on the content of the sub-slice 565 represented as a matrix of 32 bit numbers (e.g., each element of the matrix is a 32 bit number), due to the large volume of the content, BWT may perform poorly. In order to use BWT efficiently on the content of the sub-slice 565, in 570, each 32 bit number in the sub-slice 565 may be separated into four separate bytes, each byte having 8 bits (numbers ranging between 0 and 255), assuming the conversion ratio is four to one. However, other conversion ratios may be used. For example, if the conversion ratio is two to one, each 32 bit number in the sub-slice 565 may be separated into 2 separate words, each word having 16 bits. The content of 570 is represented as a matrix where each 32 bit number in the matrix of the sub-slice 565 is separated into four separate bytes. At 575, the matrix of 570 is converted into a vector and at 580, BWT is implemented on the vector of 575. 580 may be the slice BWT circuit 550 of FIG. 5A, which applies the first BWT to the stress data of a slice before the slice is encoded by the encoder 535.

In some embodiments, BWT may be useful for searching and compression. BWT is also invertible, as given the BWT of a string (e.g., string L of FIG. 5B), the original string (e.g., string S) may be reconstructed. In some example embodiments, BWT algorithm may be implemented in the order of $O(n^2 \log(n))$ (e.g., "O" implies order of magnitude: multiple of 10s are one order of magnitude, multiples of 100 is another, etc.) by creating and sorting the BWT matrix explicitly, where n is the vector length that the BWT algorithm 580 is implemented for. There are many implementations of BWT with O(n) complexity and O(n) memory requirements. For example, suffix arrays and suffix trees may be used by utilizing correspondence between suffix array and BWT, as storing constants may take large volume of memory. In some example embodiments, MTF may be applied after BWT. For example, to encode a byte ranging between 0 and 255, index of the byte in the current vector list may be used to move the byte to the front of the list. In some embodiments, where MTF is used after BWT, runs of the same byte may lead to runs of 0s and common letters may get small numbers, while rare letters may get big numbers. In some example embodiments, run length encoding (RLE) scheme may be applied after MTF to replace runs of 0s with the count of 0s.

In some embodiments, permutations are employed to distribute the compression errors within the slices, and to avoid an accumulation of such errors in a value, or in a small number of values, in each slice. Further details of implementation of permutation to distribute the compression errors within the slices may be found in U.S. Non-Provisional patent application Ser. No. 15/980,623 filed May 15, 2018 and entitled "PERMUTATION BASED STRESS PROFILE COMPRESSION," the entire content of which is hereby expressly incorporated by reference.

Figure 5E:
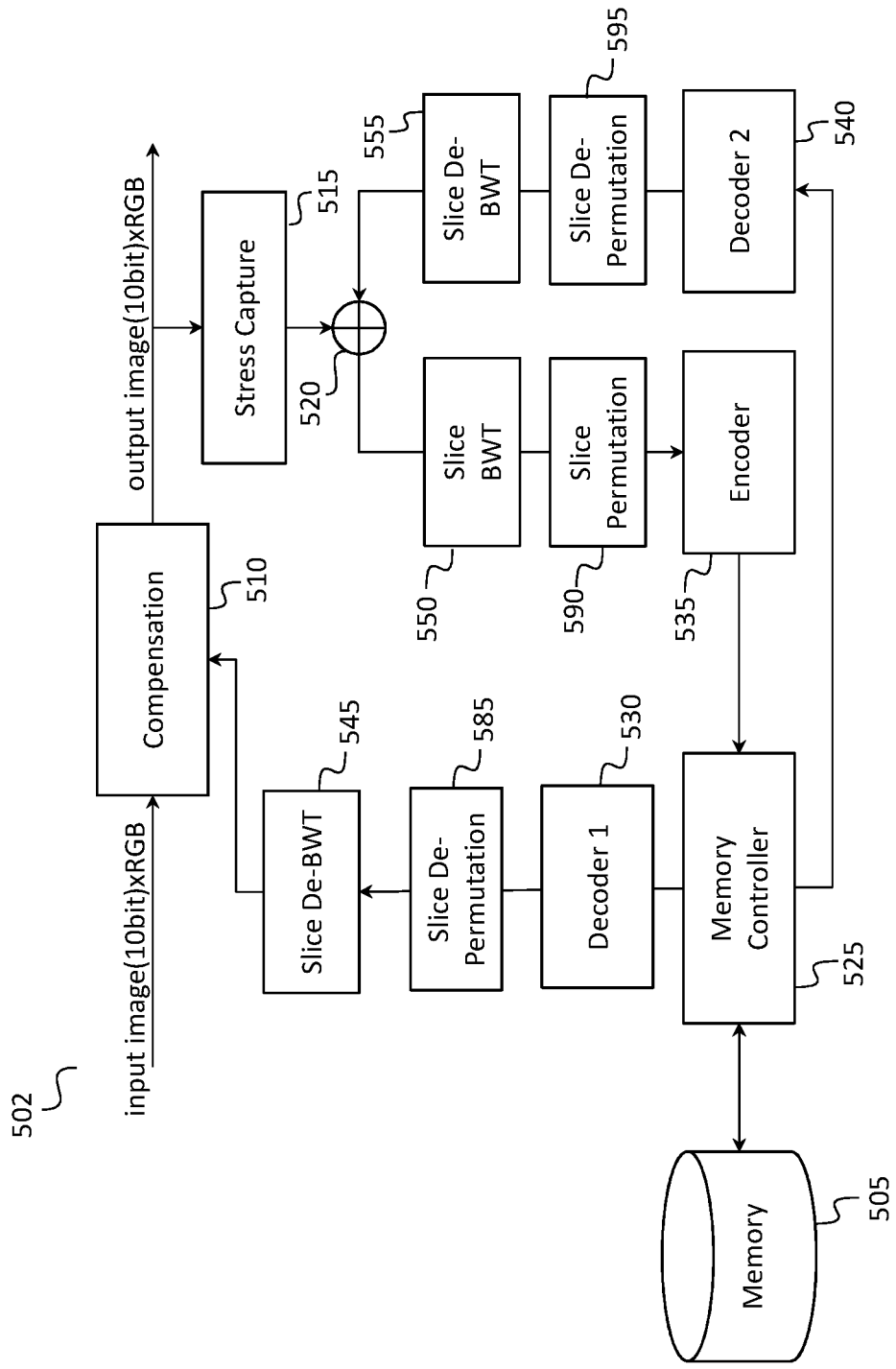
FIG. 5E illustrates a block diagram of an example system for implementing permutation and BWT for stress compensation, according to some example embodiments of the present disclosure.

FIG. 5E illustrates a block diagram of an example system 502 for implementing permutation in the method of stress compensation using BWT of FIG. 5A. The system 502 of FIG. 5E includes all the blocks of the block diagram of FIG. 5A. A slice permutation circuit 590 applies a first permutation to the transformed stress profile, which is the output from the slice BWT circuit 550 before the slice is encoded by the encoder 535. After any compressed slice is decoded by the first decoder 530, a first slice de-permutation circuit 585 applies a second permutation to the decompressed transformed stress profile of the display, which is the output of the first decoder 530. The second permutation is an inverse of the first permutation so that the output of the first slice de-permutation circuit 585 is the same as, or nearly the same as (differing, for example, by discrepancies resulting from truncation, as discussed above), the uncompressed slice data that were processed by the slice permutation circuit 590 and by the encoder 535 to form the compressed slice. Similarly, after any compressed slice is decoded by the second decoder 540, a second slice de-permutation circuit 595 applies the second permutation to the output of the second decoder 540, so that the output of the second slice de-permutation circuit 595 is the same as, or nearly the same as, the uncompressed slice data that were processed by the slice permutation circuit 590 and by the encoder 535 to form the compressed slice.

Various permutations may be employed. For example, in some embodiments, the permutation applied by the slice permutation circuit 590 (which may be referred to as the "forward permutation" to distinguish it from the inverse permutation) is a circular shift beginning from a starting location in the slice. Referring to FIG. 6A, in such an embodiment, the input, for a slice, to the slice permutation circuit 590 may be a first sequence of stress values, the first value in the first sequence being the result of the implementation of slice BWT (e.g., by the slice BWT circuit 550) on the first stress value in the slice, the second value in the first sequence being the result of the implementation of slice BWT on the second stress value in the slice, and so on, i.e., the first sequence may consist of all of the stress values of the slice, in order, after the BWT is implemented on the stress values of the slice.

In some embodiments, the starting location of the permutation determines the amount of circular shift. For example, if the starting location is one, then the permutation leaves the order unchanged (e.g., the amount of the circular shift is zero). In general, the amount of the circular shift may be one less than the starting location. The starting point may be selected randomly (e.g., based on a pseudorandom number generated by a pseudorandom number generator), each time the slice permutation circuit 590 performs a permutation operation. The starting point may also be selected to increase or decrease in uniform increments, e.g., by one position (i.e., by the size of one stress value) each time the same slice is compressed, or by a number of positions selected so that the number of stress values in the slice and the number of positions are coprime.

In some embodiments, the starting point may be selected randomly (e.g., based on a pseudorandom number generated by a pseudorandom number generator), each time the slice permutation circuit 590 performs a permutation operation on the first slice. For the rest of the slices, the starting point may be calculated based on a fixed equation or pattern or location of the slice based on the first selected randomly starting point. For example, the amount of a circular shift for a j-th slice may be given by A1+j B mod NS where A1 is the (e.g., pseudorandom) amount of the circular shift of the first slice, B is a constant, and NS is the slice length for permutation's block input. The value j ranges from 1 to the number of slices, which may be, for example, 120. The slice length may be the number of pixels in the slice or the number of pixels in the slice divided by an averaging size, if averaging within a slice is used.

In some embodiments, the inverse permutation may be a circular shift having a starting location that is the difference between the number of stress values in the slice and the starting location of the permutation. Accordingly, the starting location of the inverse permutation may be calculated (e.g., by the first slice de-permutation circuit 585 or by the second slice de-permutation circuit 595) from the starting location of the forward permutation, which may be, for example, stored with the encoded data, or generated, at the time of decoding, by a second pseudorandom number generator that generates the same sequence of pseudorandom numbers (e.g., the second pseudorandom generator being initialized to generate numbers suitably offset in time).

In some embodiments, referring to FIG. 6B, the forward permutation is an up-down switch, for example, a reversal of the order of elements in the direction perpendicular to the lines of the display. The inverse permutation in this embodiment is the same as the forward permutation, for example, another reversal of the order of elements. In some embodiments, the permutation is applied every other time that the slice is encoded. In some embodiments, the permutation is applied to randomly selected occasions, for example, on each occasion that the slice is encoded and that a pseudorandom bit generator, for example, a linear feedback shift register generates a bit having a value of one. Equivalently, an identity permutation (e.g., a permutation that leaves the order of the elements unchanged) is performed (e.g., instead of a non-identity permutation) when the pseudorandom bit generator generates a bit having a value of zero.

In some embodiments, referring to FIG. 6C, the forward permutation is a right-left switch, for example, a reversal of the order of elements in the direction parallel to the lines of the display. The inverse permutation in this embodiment is the same as the forward permutation, for example, another reversal of the order of elements. In some embodiments, the permutation is applied every other time that the slice is encoded. In some embodiments, the permutation is applied to randomly selected occasions.

Figure 7:
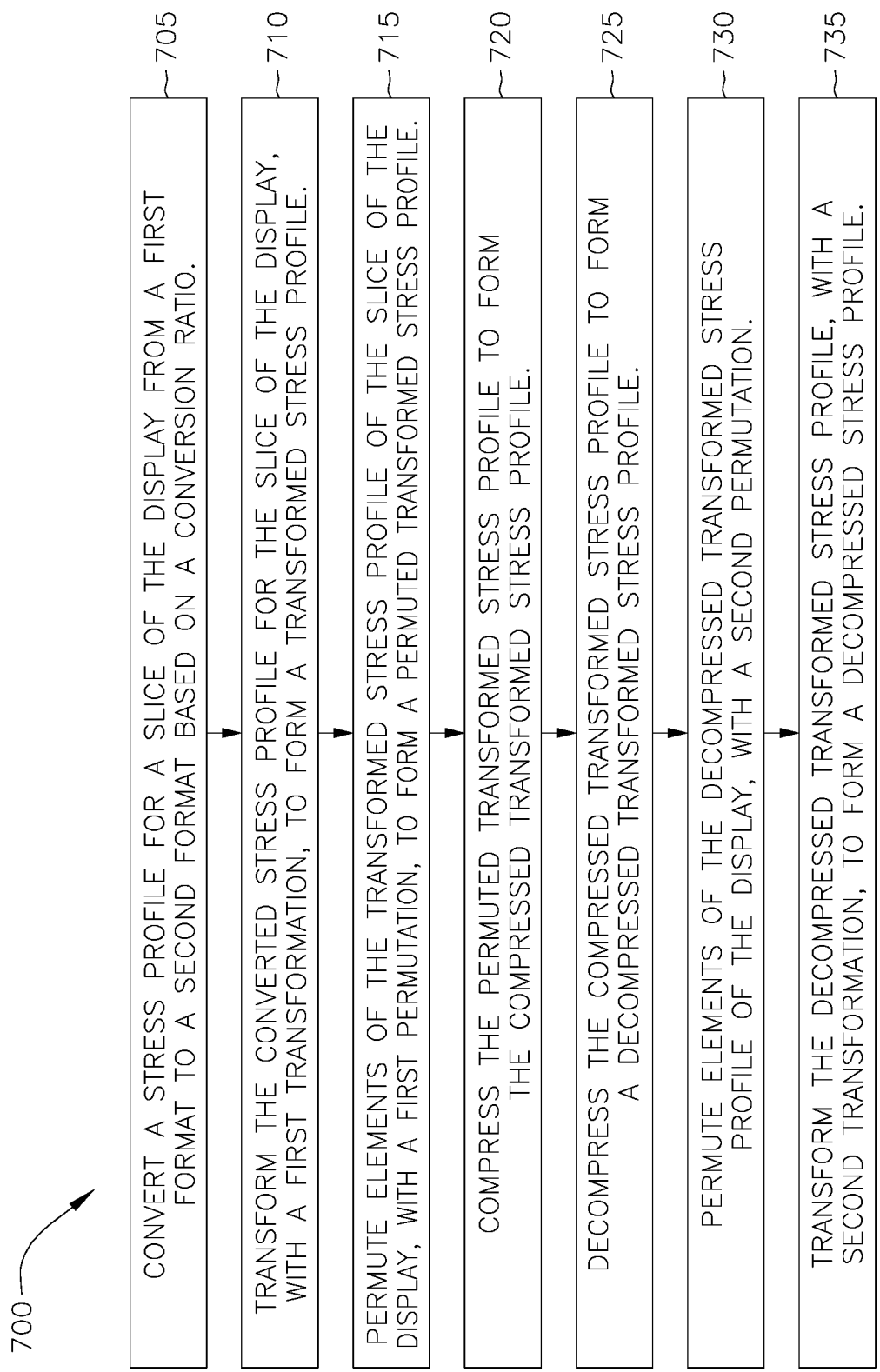
FIG. 7 illustrates an embodiment of a method of stress compensation, according to some example embodiments of the present disclosure.

FIG. 7 illustrates an embodiment of a method 700 of stress compensation. The method 700 may be performed by the system 502 of FIG. 5E recursively in each iteration. At 705, a stress profile for a slice of the display is converted from a first format to a second format based on a conversion ratio. For example, the slice BWT circuit 550 of FIG. 5E converts the stress profile of a slice of the display by dividing each slice of stress profile into a plurality of sub-slices, where the contents of a sub-slice may be 32 bit numbers. The slice BWT circuit 550 may then separate each 32 bit number in the sub-slice into four separate bytes, each byte having 8 bits, assuming the conversion ratio is four to one. The content of the sub-slice may form a conceptual matrix where each 32 bit number in the matrix of the sub-slice is separated into four separate bytes (e.g., four separate numbers between 0 and 255). The slice BWT circuit 550 may then convert the newly formed matrix of the newly formatted contents of the sub-slice into a vector. Each sub-slice of the slice of the stress profile may be processed similarly before applying BWT on the slice.

At 710, converted stress profile for the slice of the display is transformed with a first transformation to form a transformed stress profile. For example, the slice BWT circuit 550 applies a first BWT to the newly formatted (from 32 bits to four separate bytes) stress data of the slice to generate a transformed stress profile of the slice.

At 715, elements of the transformed stress profile of the slice of the display are permuted with a first permutation to form a permuted transformed stress profile. For example, slice permutation circuit 590 applies a first permutation to the transformed stress profile, which is the output from the slice BWT circuit 550, to form the permuted transformed stress profile.

At 720, the permuted transformed stress profile is compressed to form the compressed transformed stress profile. For example, the permuted transformed stress profile of the slice is encoded or compressed by the encoder 535 to form a compressed transformed stress profile of the slice.

At 725, the compressed transformed stress profile of the slice is decompressed to form a decompressed transformed stress profile. For example, the decoder 530 decompresses the compressed transformed stress profile of the slice to form a decompressed transformed stress profile.

At 730, elements of the decompressed transformed stress profile of the display are permuted with a second permutation. For example, the first slice de-permutation circuit 585 applies a second permutation to the decompressed transformed stress profile of the display, which is the output of the first decoder 530. The second permutation is an inverse of the first permutation so that the output of the first slice de-permutation circuit 585 is the same as, or nearly the same as (differing, for example, by discrepancies resulting from truncation, as discussed above), the uncompressed slice data that were processed by the slice permutation circuit 590 and by the encoder 535 to form the compressed slice.

At 735, the decompressed transformed stress profile is transformed with a second transformation to form a decompressed stress profile. For example, the first slice de-BWT circuit 545 applies a first inverse BWT to the decompressed transformed stress profile. The first inverse BWT being an inverse of the first BWT so that the output of the first slice de-BWT circuit 545 is the same as, or nearly the same as (differing, for example, by discrepancies resulting from truncation, as discussed above), the uncompressed slice data that were processed by the slice BWT circuit 550 and by the encoder 535 to form the compressed slice.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Although exemplary embodiments of a system and a method for mitigating the effects of compression errors using Burrows-Wheeler based stress profile compression have been specifically described and illustrated herein, many modifications and variations will be apparent to those skilled in the art. Accordingly, it is to be understood that to a system and a method for mitigating the effects of compression errors using Burrows-Wheeler based stress profile compression constructed according to principles of this disclosure may be embodied other than as specifically described herein. The inventive concept is also defined in the following claims, and equivalents thereof

What is claimed is:

1. A method of stress compensation in a display, the method comprising:
converting a stress profile for a slice of the display from a first format to a second format based on a conversion ratio;
transforming the converted stress profile for the slice of the display, with a first transformation, to form a compressed transformed stress profile;
decompressing the compressed transformed stress profile to form a decompressed transformed stress profile; and
transforming the decompressed transformed stress profile, with a second transformation, to form a decompressed stress profile, the second transformation being an inverse of the first transformation.

2. The method of claim 1, wherein converting the stress profile for the slice of the display comprises:
dividing the slice into a plurality of sub-slices; and
converting each element of content of each sub-slice from the first format to the second format to generate the converted stress profile, wherein in the first format, each element of each sub-slice is a 32 bit number, and in the second format, each element of each sub-slice is divided into four separate bytes, each byte containing 8 bits, wherein the conversion ratio is four to one.

3. The method of claim 2, wherein the first transformation is Burrows-Wheeler transform (BWT) and the second transformation is inverse BWT.

4. The method of claim 3, wherein the BWT is applied on each element of each sub-slice after each element of each sub-slice is divided into four separate bytes, each byte containing 8 bits, to generate a transformed stress profile of the slice of the display.

5. The method of claim 4, wherein a data compression algorithm is applied on the transformed stress profile of the slice to generate the compressed transformed stress profile.

6. The method of claim 5, wherein the data compression algorithm is bzip2.

7. The method of claim 4, wherein transforming the converted stress profile for the slice of the display further comprising:

permuting elements of the transformed stress profile of the slice of the display, with a first permutation, to form a permuted transformed stress profile; and compressing the permuted transformed stress profile to form the compressed transformed stress profile.

8. The method of claim 7, wherein transforming the decompressed transformed stress profile comprising:

permuting elements of the decompressed transformed stress profile of the display, with a second permutation, wherein the second permutation is an inverse of the first permutation.

9. The method of claim 7, wherein the first permutation is a circular shift by a constant amount.

10. The method of claim 7, wherein the first permutation is a circular shift by a pseudorandom amount.

11. The method of claim 7, wherein the first permutation is a circular shift.

12. The method of claim 11, wherein transforming the decompressed transformed stress profile, with the second transformation, to form the decompressed stress profile, is based on permuting the elements of the decompressed transformed stress profile of the display.

13. The method of claim 1, further comprising:

storing the compressed transformed stress profile in a memory.

14. A system for performing stress compensation in a display, the system comprising:

a memory; and a processing circuit configured to:

convert a stress profile for a slice of the display from a first format to a second format based on a conversion ratio;

transform the converted stress profile for the slice of the display, with a first transformation, to form a compressed transformed stress profile;

decompress the compressed transformed stress profile to form a decompressed transformed stress profile; and transform the decompressed transformed stress profile, with a second transformation, to form a decompressed stress profile, the second transformation being an inverse of the first transformation.

15. The system of claim 14, wherein the processing circuit is further configured to:

divide the slice into a plurality of sub-slices; and convert each element of content of each sub-slice from the first format to the second format to generate the converted stress profile, wherein in the first format, each element of each sub-slice is a 32 bit number, and in the second format, each element of each sub-slice is divided into four separate bytes, each byte containing 8 bits, wherein the conversion ratio is four to one.

16. The system of claim 15, wherein the first transformation is Burrows-Wheeler transform (BWT) and the second transformation is inverse BWT, and wherein the BWT is applied on each element of each sub-slice after each element of each sub-slice is divided into four separate bytes, each byte containing 8 bits, to generate a transformed stress profile of the slice of the display.

17. The system of claim 16, wherein a data compression algorithm is applied on the transformed stress profile of the slice to generate the compressed transformed stress profile.

18. The system of claim 16, wherein the processing circuit is further configured to:

permute elements of the transformed stress profile of the slice of the display, with a first permutation, to form a permuted transformed stress profile; and compress the permuted transformed stress profile to form the compressed transformed stress profile.

19. A display, comprising:

a display panel;

a memory; and a processing circuit configured to:

convert a stress profile for a slice of the display from a first format to a second format based on a conversion ratio;

transform the converted stress profile for the slice of the display, with a first transformation, to form a compressed transformed stress profile;

decompress the compressed transformed stress profile to form a decompressed transformed stress profile; and transform the decompressed transformed stress profile, with a second transformation, to form a decompressed stress profile, the second transformation being an inverse of the first transformation.

20. The display of claim 19, wherein the processing circuit is further configured to:

divide the slice into a plurality of sub-slices; and convert each element of content of each sub-slice from the first format to the second format to generate the converted stress profile, wherein in the first format, each element of each sub-slice is a 32 bit number, and in the second format, each element of each sub-slice is divided into four separate bytes, each byte containing 8 bits, wherein the conversion ratio is four to one, wherein the first transformation is Burrows-Wheeler transform (BWT) and the second transformation is inverse BWT, and wherein the BWT is applied on each element of each sub-slice after each element of each sub-slice is divided into four separate bytes, each byte containing 8 bits, to generate a transformed stress profile of the slice of the display.

* * * * *